United States Patent

Pammer

[15] 3,657,007

[45] Apr. 18, 1972

[54] METHOD FOR PRODUCING AN INSULATING LAYER ON THE SURFACE OF A SEMICONDUCTOR CRYSTAL

[72] Inventor: Erich Pammer, Munich, Germany

[73] Assignee: Siemens Aktiengesellschaft, Berlin and Munich, Germany

[22] Filed: Nov. 28, 1969

[21] Appl. No.: 880,561

[30] Foreign Application Priority Data

Dec. 3, 1968 Germany ......................P 18 12 455.5

[52] U.S. Cl. ..............................................117/201, 117/106

[51] Int. Cl. ..........................................H01l 7/28, H01b 3/10

[58] Field of Search ................117/201, 106 R, 106 A, 106 D

[56] References Cited

UNITED STATES PATENTS

| | | | |
|---|---|---|---|
| 3,502,502 | 3/1970 | Elsby | 117/201 |
| 3,511,703 | 5/1970 | Peterson | 117/106 R |
| 3,356,703 | 12/1967 | Mazdiyasni et al. | 117/106 R |
| 3,484,278 | 12/1969 | Taebel et al. | 117/106 R |

*Primary Examiner*—William L. Jarvis
*Attorney*—Curt M. Avery, Arthur E. Wilfond, Herbert L. Lerner and Daniel J. Tick

[57] ABSTRACT

Method of producing an insulating layer on the surface of a semiconductor crystal. The protective layer comprising a metal oxide, is precipitated through oxidation of a gaseous, halogen free organic compound of the metal Me, upon which the oxide is based, with at least one Me-C bond. The precipitation is effected at the surface of the heated semiconductor crystal whereby the rest of the components of the organic compound remain in the gaseous phase.

3 Claims, 2 Drawing Figures

Figure 1:
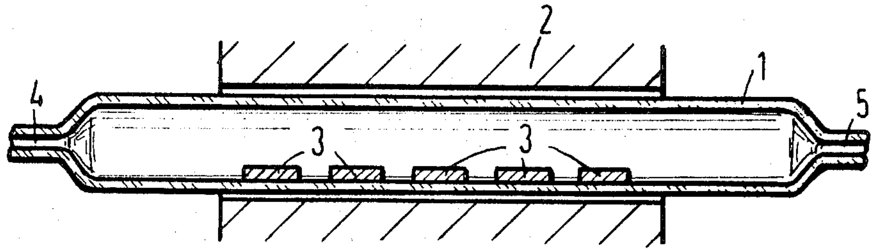

METHOD FOR PRODUCING AN INSULATING LAYER ON THE SURFACE OF A SEMICONDUCTOR CRYSTAL

It is customary to provide the surface of semiconductor components, especially those comprised of silicon or germanium with an insulating protective layer of $SiO_2$ and/or $Si_3N_4$, which serves to preserve the electrical properties. Such protective layers are also desired during the production of diffusion transistors and diodes as well as for other semiconductor components of planar structure, that are produced by diffusion, as well as during the production of integrated circuits. They serve as diffusion maskings when equipped with appropriate windows that extend to the semiconductor surface. Finally, insulating protective layers are used in field effect transistors (FET) and similar devices using an insulated control electrode.

Most of these usages require a high quality for the crystalline characteristics of these protective layers. The above named protective layer materials have the advantage that they can be produced relatively easy on the surface of the semiconductor. Thus, for example, in order to produce a $SiO_2$ protective layer on a silicon surface, the surface is subjected to thermal dissociation and/or to a chemical oxidation. The electric properties of such protective layers are not of equally high quality, in all cases. Their use as diffusion masks is partially very limited due to a number of doping materials which, as in the case of $SiO_2$ or even $Si_3N_4$, are only insufficiently preventive from diffusing into the below-lying semiconductors. It then becomes necessary to use very thick protective layers, which is cumbersome and not even desirable in the interest of the doping, which is already present in the semiconductor crystal. For the aforementioned reason, it appears that other materials are preferred as insulating protective layers.

The invention relates to the objective of producing more protective layer material. Moreover, the protective layers obtained according to the invention, are pore free, have excellent electrical insulating properties and close certain deficiencies of the known protective layer materials, such as $SiO_2$ and $Si_3N_4$, with respect to their masking properties.

The present invention relates to a method for producing an insulating layer on the surface of a semiconductor crystal which is characterized by the fact that the protective layer, comprising metal oxide, is precipitated through oxidation of a gaseous, halogen free organic compound of the metal Me, upon which the oxide is based, with at least one Me—C compound. The precipitation is effected on the surface of the heated semiconductor crystal whereby the other components of the organic compound remain in the gaseous phase, especially by being oxidized into volatile reaction products.

The organic compound is preferably a metal alkyl, a metal aryl or a metal carbonyl. The active components of the reaction gas are thinned or diluted with an inert gas, preferably argon. Furthermore, the gas must be mixed either with pure oxygen or with an oxygen separating compound in gaseous form, for example $CO_2$ or $H_2O$ vapor.

The use of a carrier gas, for example an oxidizing gas and/or an inert gas, permits the same technique to be applied in the production of the reaction gas, required for the invention, that is used for the production of reaction gases used for the precipitation of silicon or germanium. For example, a liquid metal compound is placed in a vaporizer. The carrier gas passes through said vaporizer wherein it becomes charged with the vapor of the metal compound. The gas, which leaves the vaporizer, is then supplied to the reaction vessel which contains the semiconductor crystals to be coated. The concentration of the organometallic compound can be exactly adjusted by the temperature in the vaporizer. In order to obtain oxide layers with high quality, it is recommended to dilute the active component of the reaction gas to such an extent, that the precipitation within the reaction vessel remains limited to, or is preferably at the surface of the heated semiconductor crystals.

The resultant protective layers can be used not only for an electrical stabilization of semiconductor components, but also for diffusion masking, for maskings during the production of alloyed p-n junctions, for maskings for local epitactic precipitation of semiconductor material from a gaseous phase and as a dielectric for the production of field effect transistors. The layers have an excellent homogeneity, are all transparent and of a uniform thickness when the semiconductor surface is prepared with appropriate care. Most of all, the present invention is suitable for the production of protective layers of $Al_2O_3$, BeO, the rare earth oxides, $Sc_2O_3$, $Y_2O_3$, $La_2O_3$, $TiO_2$, $ZrO_2$, $ThO_2$, $Cr_2O_3$, $V_2O_5$, $Nb_2O_5$, $Ta_2O_5$, $Mn_2O_3$, $Fe_2O_3$, ZnO, CdO. For all metals upon which these oxides are based, there are volatile, organo-metallic compounds such as aryl metal and alkyl metal. Some of these metals also form carbonyls which also can be used as bases for the production of reaction gases.

Another component of the reaction gas is either oxygen or an oxygen containing gas, such as for example NO or $H_2O$ vapor. The content of the reaction gas constituting oxygen or oxidation agents must be at least such, that a metal free oxide precipitation takes place at the surface of the heated semiconductor crystal and that free carbon or carbon containing dissociation products, which can enter the resultant layer, are not also precipitated during the same process. Rather, all components with the exception of the metal compound remain in the gaseous phase.

An undesired oxidation of the semiconductor surface can be eliminated, if necessary, by adding only as much oxygen or oxidizing gas that, aside from the formation of metal oxide, only the carbon of the metal compound oxidizes into CO but not the hydrogen which may also be present. With respect to silicon, the formed CO has no oxidizing effect up to temperatures of 1,100°C and with respect to germanium, up to 955°C.

In organo-metallic compounds, which react especially easy with oxygen, sometimes even explosively, such as $Al(C_2H_5)_3$ and $Zn(C_2H_5)_2$, the oxygen is mixed, similarly as in an oxyhydrogen burner, directly at the semiconductor surface with the respective metal carbonyl. It is even more preferable, to introduce the oxygen in compound form, e.g. as water vapor, $CH_3OH$ vapor, NO, $N_2O$ and $CO_2$. Using methyl alcohol as the oxidation agent and trimethyl aluminum as the organo-metallic compound, the process takes place according to the Equation:

$$2Al(CH_3)_3 + 6CH_3OH = Al_2O_3 + 6CH_4 + 3CH_3OCH_3$$

To produce beryllium oxide layers, the following reaction occurs:

$$Be(C_2H_5)_2 + CO_2 = BeO + CO + C_2H_6 + C_2H_4$$

In principle, all organometals can be used whose affinity to oxygen relative to the metal bound therein, is greater that to carbon. Accordingly, when gaseous compounds which supply oxygen or when oxygen itself is admixed, the organometal oxidizes into metal oxide and, depending on the $O_2$ excess, into CO, $CO_2$ or into volatile organic oxidation products and water. A variable amount of oxygen in the reaction gas can become noticeable according to the following two Equations:

a. with less oxygen:

$$2Al(CH_3)_3 + 3O_2 = Al_2O_3 + 6CO + 9H_2$$

b. with more oxygen:

$$2Al(CH_3)_3 + 9O_2 = Al_2O_3 + 3CO_2 + 9H_2O$$

In addition to the described embodiments, suitable metal-supplying original compounds are: $BeR_2$; $AlR_3$; $TiR_4$; $ZrR_4$; $HfR_4$; appropriate rare earth compounds; e.g. $LaR_3$; $NdR_3$; $ZnR_2$; $CdR_2$; $BiR_3$ and $SbR_3$. In the aforegoing, R is a monovalent organic radical, e.g. a methyl, ethyl or $C_6H_5$ group. Other compounds to be considered are, the previously mentioned carbonyls which are present, e.g., in the iron, chromium, nickel and manganese [$Fe(CO)_5$, $Ni(CO)_4$, $CR(CO)_6$,$Mn_2(CO)_{10}$]. Furthermore, carbonyls wherein one or more CO groups are partly dissociated or analogously structured Nitrosyl (NO) or Isonitryl (CNR) radical, for example the compounds $Fe(CO)_2$ and $Ni(CNC_6H_5)_4$ can be used. Also to be considered, are the so-called "sandwich compounds" or complexes of transition metals, e.g. ferrocen $(C_6H_5)Fe$ (cyclopenthadinyl iron) or dibenzolchromium $(C_6H_6)Cr$. These may also be called $\pi$ complexes.

The protective layers obtained with the method of the present invention, can usually be employed as diffusion masks. The oxide layers, which are chemically precipitated at high temperatures, are also chemically stable and, as a result, etchants must usually be employed in the production of diffusion windows, which are also used for the same purpose, in protective layers of $SiO_2$ or $Si_3N_4$.

Preferred for use in thin film condensors are coatings with $Al_2O_3$, $HfO_2$, $La_2O_3$, $Y_2O_3$ and $Ta_2O_5$. For MOS structures (field effect transistors, etc.) and for making integrated circuits passive, the most preferable coatings are $Al_2O_3$ or BeO.

Figure 2:
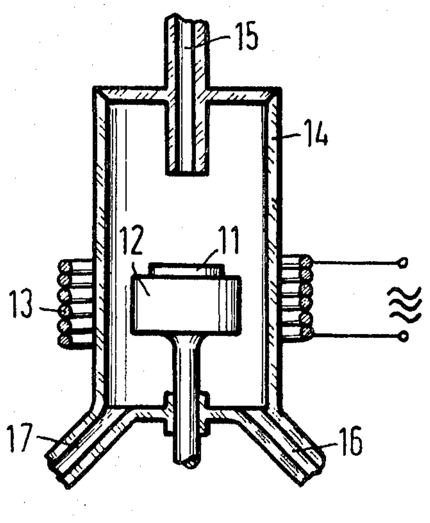

The invention will be further described with reference to the drawing in which:

FIG. 1 shows a tubular furnace used for heating the semiconductor wafers arranged in a quartz tube; and FIG. 2 shows an inductive means for heating the semiconductor wafers which are to be coated.

FIG. 1, a quartz tube 1 is heated by a tubular furnace 2, to the required temperature. The tube contains within the heating range of the furnace 2, semiconductor crystals 3, or finished semiconductor devices and is heated, for example to 200° to 300° C. The reaction gas is preferably mixed outside the reaction tube and is introduced into the latter, at inlet 4. The gas travels along a cross-section of $30cm^2$, for example at a speed of 2 liters/minute. It is preferably thinned or diluted with argon or nitrogen and contains, as disclosed above, an oxidation agent. For example, the reaction gas used to produce an $Al_2O_3$ layer, comprises two separate gas currents of argon with 2 Mol% $Al(CH_3)_3$ and argon with 3 to 9 Mol% $O_2$. The oxidizing gas too, can be diluted with argon. The oxidizing component of the reaction gas and the metal supplying component are preferably joined in this case, directly at the location of the silicon crystals to be coated. Under the aforementioned circumstances, $Al_2\,O_3$ layers which are completely pore free and transparent, are obtained on the surface of the silicon crystals. A thickness of about 1$\mu$ is produced after a precipitation period of 10 minutes.

In the arrangement shown in FIG. 2, a semiconductor wafer 11 is located on a platform 12, for example of a metal, coated with carbon or with silicon and heated by an induction coil 13 which is preferably located outside the quartz reaction tube 14. The reaction gas is introduced at inlet 15 and an oxidation agent, such as $H_2O$ vapor is introduced at inlet 16, while the exhaust gases leave the reaction vessel at outlet 17. A separate supply of the oxidation agent is always recommended when the organo-metallic compound could react prematurely with the oxidation agent. Such reaction possibilities are, for example, spontaneous oxidations or hydrolytic dissociation when water vapor is employed as an oxidation agent.

In such and in similar cases it is therefore preferable to join the reaction partners, if possible, directly at the coating location.

I claim:

1. The method of precipitating an insulating layer of $Al_2O_3$ on the surface of a semiconductor crystal, which comprises passing a reaction gas comprising an inert carrier gas, an organometallic aluminum compound with an Al—C bond, in the form of an alkyl or aryl, an organometallic $\pi$ complex, or an etherate and an oxygen compound or a compound which has an oxidizing effect, or releases oxygen, the oxygen content in the reaction gas being just high enough so that from the aluminum compound in the reaction gas $Al_2O_3$ precipitates the carbon oxidized to CO, while the hydrogen which is present is released in elemental form.

2. The method of claim 1, wherein the metal compound is admixed with an oxygen source, such as $O_2$, $CO_2$, NO or $H_2O$ vapor.

3. The method of claim 1, wherein the organo-metallic compounds are atherates selected from $Al(C_2H_5)_3 \cdot O(C_2H_5)_2$ and $Al(CH_3)_3 \cdot O(C_2H_5)$.

* * * * *